(12) United States Patent
Zhang et al.

(10) Patent No.: US 8,921,976 B2
(45) Date of Patent: Dec. 30, 2014

(54) USING BACKSIDE PASSIVE ELEMENTS FOR MULTILEVEL 3D WAFERS ALIGNMENT APPLICATIONS

(75) Inventors: John H. Zhang, Fishkill, NY (US); Lawrence A. Clevenger, LaGrangeville, NY (US); Yiheng Xu, Hopewell Junction, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/324,791

(22) Filed: Dec. 13, 2011

(65) Prior Publication Data

US 2012/0187530 A1  Jul. 26, 2012

Related U.S. Application Data

(60) Provisional application No. 61/436,146, filed on Jan. 25, 2011.

(51) Int. Cl.
| | |
|---|---|
| *H01L 27/08* | (2006.01) |
| *H01L 25/00* | (2006.01) |
| *H01L 25/065* | (2006.01) |
| *H01L 27/06* | (2006.01) |
| *H01L 23/64* | (2006.01) |
| *H01L 23/00* | (2006.01) |

(52) U.S. Cl.
CPC ............ *H01L 27/0694* (2013.01); *H01L 25/50* (2013.01); *H01L 2924/19041* (2013.01); *H01L 24/80* (2013.01); *H01L 2924/01322* (2013.01); *H01L 25/0657* (2013.01); *H01L 2224/80805* (2013.01); *H01L 2924/19042* (2013.01); *H01L 2924/19043* (2013.01); *H01L 23/645* (2013.01); *H01L 2225/06541* (2013.01); *H01L 24/05* (2013.01); *H01L 2924/19104* (2013.01); *H01L 2224/131* (2013.01); *H01L 2924/14* (2013.01); *H01L 2224/80896* (2013.01); *H01L 24/13* (2013.01); *H01L 2924/19015* (2013.01); *H01L 2924/01029* (2013.01); *H01L 2224/05548* (2013.01); *H01L 2224/13024* (2013.01); *H01L 2224/0401* (2013.01); *H01L 24/29* (2013.01); *H01L 2224/80895* (2013.01); *H01L 2224/32145* (2013.01); *H01L 2223/6677* (2013.01); *H01L 2224/80357* (2013.01); *H01L 2924/1461* (2013.01); *H01L 24/32* (2013.01); *H01L 24/94* (2013.01); *H01L 2224/2919* (2013.01); *H01L 2224/02372* (2013.01)

USPC ........... 257/531; 257/678; 257/686; 257/777; 438/107

(58) Field of Classification Search
CPC .................................................... H01L 27/0694
USPC .......... 257/531, 678, 684–686, 724, 777, 778
See application file for complete search history.

(56) References Cited

U.S. PATENT DOCUMENTS

| | | | |
|---|---|---|---|
| 6,885,090 B2 * | 4/2005 | Franzon et al. | ................ 257/678 |
| 7,531,407 B2 | 5/2009 | Clevenger et al. | |

(Continued)

OTHER PUBLICATIONS

Anc M, Perspectives of Simox Technology, Progress in SOI Structures and Devices Operating at Extreme Conditions, NATO Science Series vol. 58, 2002, p. 1-10 *http://books.google.com/books?id=oB_yspURTWwC&Ipg=PR9&ots=xL-myKj_uk&dq=Anc%20Perspectives%20of%20SIMOX%20technology&Ir&pg=PA19#v=onepage&q=Anc%20Perspectives%20of%20SIMOX%20technology&f=false.*

*Primary Examiner* — Allen Parker
*Assistant Examiner* — Gardner W Swan
(74) *Attorney, Agent, or Firm* — Seed IP Law Group PLLC

(57) ABSTRACT

Passive circuit elements are formed at surfaces of two integrated circuit wafers. The passive circuit elements are utilized to align the two integrated circuit wafers to form an integrated circuit wafer stack.

13 Claims, 17 Drawing Sheets

(56) References Cited

U.S. PATENT DOCUMENTS

| | | | |
|---|---|---|---|
| 2001/0001497 A1* | 5/2001 | Utsunomiya et al. | 257/355 |
| 2009/0322461 A1* | 12/2009 | Hebert et al. | 336/83 |
| 2010/0246152 A1* | 9/2010 | Lin et al. | 361/783 |
| 2011/0156284 A1 | 6/2011 | Zhang et al. | |

* cited by examiner

USING BACKSIDE PASSIVE ELEMENTS FOR MULTILEVEL 3D WAFERS ALIGNMENT APPLICATIONS

CROSS-REFERENCE TO RELATED APPLICATION

This application claims the benefit under 35 U.S.C. §119 (e) of U.S. Provisional Patent Application No. 61/436,146 filed Jan. 25, 2011 and is incorporated herein by reference in its entirety.

BACKGROUND

1. Technical Field

The present disclosure relates to alignment structures formed on a plurality of wafers configured to be aligned to form a multichip stack in a single package.

2. Description of the Related Art

As consumer demand increases for smaller multifunction devices, manufacturers face significant challenges to integrate different semiconductor technologies on a single die. Multichip packages have become increasingly popular to increase device density and to combine traditionally incompatible technologies, such as logic, memory, and micro-electromechanical systems (MEMS). For example, as cell phones include more functions, such as personal entertainment systems, manufacturers look for ways to integrate multiple technologies, such as SRAM, DRAM, flash, logic, analog, and radio frequency, into one relatively thin package.

Multichip packages also address some of the limitations that have arisen with respect to high density scaling. In multichip packages the dies may be aligned and bonded at the wafer level or as individual die. Each of the dies to be included in a multichip package is formed on a single wafer based on a particular technology. For example, one die may be manufactured to be a processor using one process technology and then packaged with a MEMS sensor, which was separately manufactured on another wafer using different process technology.

These vertically stacked chips formed from multiple die offer improved density and performance. The challenges to integrate traditionally incompatible processes on a single wafer are avoided by forming incompatible technologies on individual wafers and packaging them in the single package.

BRIEF SUMMARY 3D wafer alignment may be accomplished by using passive circuit elements formed on the back side of two wafers that will be joined together. In one embodiment, two wafers to be aligned and stacked are brought near each other and held a selected distance from each other. Passive circuit components on each wafer are thus held a known fixed distance from each other, thereby creating a capacitance between the passive circuit elements. A test circuit is electrically coupled to the passive circuit components of each wafer. The test circuit applies an alignment test signal between the passive circuit elements and measures a voltage response signal of the passive circuit elements. The response signal of the passive circuit elements is indicative of the capacitance between the passive circuit elements. The capacitance between the passive elements indicates the vertical alignment of the passive circuit elements because the vertical alignment determines the area of lateral overlap of the passive circuit elements. The capacitance value is proportional to the overlapping area of passive elements. The passive circuit elements thus aid in aligning the wafers.

In one embodiment the passive elements of the alignment circuit include inductors. An individual inductor is formed on each wafer. During alignment the wafers are held a selected vertical separation distance from each other. When the inductors are held near each other, separated by the selected vertical separation distance, the opposing surface of each inductor acts as a respective plate of a capacitor separated by a dielectric, in this case air. The capacitance is a function of the fixed vertical distance between the inductors as well as the of overlapping surface area of the inductors. The capacitance increases as the inductors become more aligned. Thus the relative lateral positions of the wafers are adjusted until a desired response signal is achieved. The wafers are then brought into contact.

In one embodiment the passive circuit elements of the alignment circuit are capacitors and resistors. The response signal of the passive circuit elements to the alignment test signal is indicative of the lateral alignment of the passive circuit elements.

DETAILED DESCRIPTION

Figure 1:
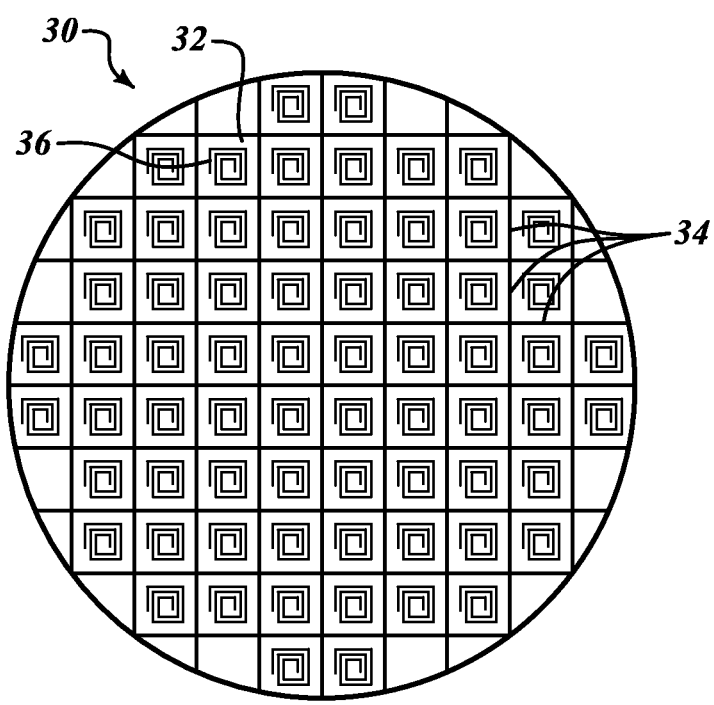
FIG. 1 is a top view of an integrated circuit wafer according to one embodiment.

FIG. 1 is a top view of an integrated circuit wafer 30 according to one embodiment. In one embodiment, this is the back side of the wafer. The integrated circuit wafer 30 includes a plurality of individual integrated circuit dies 32. The integrated circuit dies 32 are separated from each other by scribe lines 34 in a grid pattern on the integrated circuit wafer 30. Each integrated circuit die 32 includes a passive circuit element 36 formed on or near a back surface of the integrated circuit wafer 30. Each integrated circuit die 32 includes an integrated circuit formed on a front surface of a semiconductor layer of the integrated circuit wafer 30. All of the integrated circuit dies 32 are processed simultaneously on the wafer 30.

After processing of the integrated circuit wafer 30, the integrated circuit wafer 30 will be diced into individual integrated circuit dies 32 by sawing or dicing along the scribe lines 34.

In some uses multiple integrated circuit wafers 30 are stacked one on top of another to form an integrated circuit wafer stack, sometimes called a 3-Dimensional or 3D wafer stack. In an integrated circuit wafer stack, multiple integrated circuit wafers 30 are fixed together and then simultaneously diced. After dicing, integrated circuit dies from each integrated circuit wafer 30 fixed together, vertically positioned in a stack.

The integrated circuit wafer 30 is processed according to any suitable or conventional processing steps in order to form integrated circuit dies 32 on the integrated circuit wafer 30. Active circuits having any desired function are formed on a front side, sometimes called a top side, of the wafer. Passive circuit elements 36 are formed on the exposed backside of any integrated circuit die 32 in order to aid in alignment of the integrated circuit wafer and the individual integrated circuit dies 32 with another integrated circuit wafer in a 3D stack. The passive circuit elements 36 are, in one example, inductors. Alternatively, the passive circuit elements 36 can be capacitors or individual plates of a capacitor, resistors, or any other suitable circuit element.

Figure 2A:
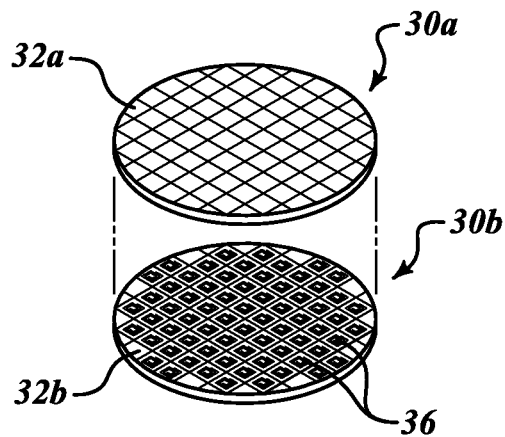
FIG. 2A is an elevated isometric view of two integrated circuit wafers to be aligned according to one embodiment.

FIG. 2A illustrates two integrated circuit wafers 30a, 30b, which will be aligned with each other and coupled together in a 3D integrated circuit wafer stack. When a single integrated circuit wafer 30 is diced into individual integrated circuit dies 32, the individual integrated circuit dies 32 are then packaged to form an integrated circuit package. When two integrated circuit wafers 30a, 30b are stacked in a 3D wafer stack, the wafers are aligned, fixed together, and simultaneously diced to form individual integrated circuit packages, each containing two integrated circuit dies 32. Each individual integrated circuit package will include an individual integrated circuit die 32a from the integrated circuit wafer 30a and an individual integrated circuit die 32b from the integrated circuit wafer 30b. The individual integrated circuit dies 32a, 32b of an integrated circuit package are electrically coupled to each other by any acceptable technique such as by through-vias formed in the integrated circuit dies 32a, 32b. In order to ensure electrical coupling between the integrated circuit die 32a and the integrated circuit die 32b, the integrated circuit wafers 30a, 30b are aligned so that through-vias from the first integrated circuit wafer 30a are in electrical contact with through-vias from the second integrated circuit wafer 30b. If the wafers 30a, 30b are misaligned, then through-vias in the individual integrated circuit dies 32a of the wafer 30a will not be electrically connected to through-vias of the individual integrated circuit dies 32b of the wafer 30b. An integrated circuit package including an integrated circuit die 32a and an integrated circuit die 32b which are misaligned may function very poorly or may not function at all.

To aid in the alignment of the wafers 30a, 30b, the wafer 30b is positioned such that the passive circuit elements 36 formed at a surface of the integrated circuit wafer 30b are facing the integrated circuit wafer 30a. Usually, this will be on the back surface so the active face, also called the top surface will be facing down for wafer 30b. The passive circuit elements 36 of the integrated circuit wafer 30a are on the back side, which is the down-facing surface of the integrated circuit wafer 30a facing the integrated circuit wafer 30b. The passive circuit elements 36 of the integrated circuit wafer 30a are not pictured in FIG. 2A because they are on a down-facing surface of the integrated circuit wafer 30a.

Figure 2B:
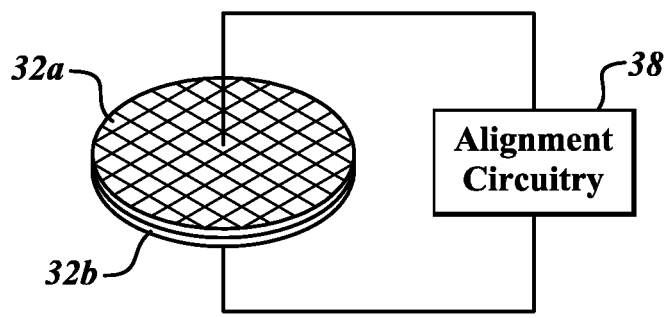
FIG. 2B illustrates wafer alignment circuitry according to one embodiment.

In FIG. 2B, the integrated circuit wafers 30a, 30b are held near each other to begin a wafer alignment process prior to coupling the integrated circuit wafer 30a to the integrated circuit wafer 30b in an integrated circuit wafer stack. Alignment circuitry 38 is connected to the integrated circuit wafer 30a and the integrated circuit wafer 30b. The alignment circuitry 38 is electrically connected to an integrated circuit die 32a of the integrated circuit wafer 30a and the corresponding integrated circuit die 32b of the integrated circuit wafer 30b. The alignment circuitry 38 passes an alignment test signal through the passive circuit elements 36a, 36b of the individual integrated circuit dies 32a, 32b. The alignment circuitry 38 analyzes a response signal from the passive circuit elements 36a, 36b to determine if the integrated circuit wafers 30a, 30b are vertically aligned.

During the alignment process, the integrated circuit wafer 30a is held a fixed distance from the integrated circuit wafer 30b while the alignment test signal is applied to the passive elements 36a, 36b. In one embodiment, the response signal is indicative of the capacitance between the passive circuit elements 36a, 36b. If the wafer 30a is aligned with the wafer 30b, then the passive elements 36a, 36b will be vertically aligned and a relatively large surface area of the passive circuit element 36a will be directly above the surface of the passive circuit element 36b, causing a relatively large capacitance between the passive elements 36a, 36b. If the integrated circuit wafers 36a, 36b are aligned within a threshold misalignment tolerance, the response signal will indicate that the capacitance between the passive circuit element 36a and the passive circuit element 36b is within a threshold capacitance range. If the integrated circuit wafer 30a is poorly aligned with the integrated circuit wafer 30b, then the response signal will indicate a lower than expected capacitance between the passive circuit element 36a and the passive circuit element 36b. The lower than expected capacitance indicates that the wafers 30a, 30b are misaligned.

If the response signal indicates that the integrated circuit wafer 30a is misaligned with the integrated circuit wafer 30b, then the relative lateral positions of the integrated circuit wafers 30a, 30b will be adjusted to improve alignment. After the lateral positions of the integrated circuit wafers 30a, 30b are adjusted the alignment test signal is again applied to the passive circuit elements 36a, 36b. Testing and lateral adjustment are performed until proper alignment is achieved. If the response signal indicates that the passive elements 36a, 36b are sufficiently aligned, then the vertical separation distance between the integrated circuit wafers 30a, 30b is decreased to a second fixed separation distance. At the second vertical separation distance, the alignment test signal is again passed through the passive circuit elements 36a, 36b, followed by adjustment and further decrease of the separation distance. Eventually, the integrated circuit wafer 30a is brought into contact with the integrated circuit wafer 30b.

When the wafer 30a is brought into contact with the wafer 30b, the passive circuit element 36a is in direct contact with the passive circuit element 36b. In an ideal case, the passive circuit element 36a is perfectly aligned with the passive circuit element 36b and the surfaces of the passive circuit elements 36a, 36b are in direct contact with each other. In practice, some minor amount of misalignment can occur, but as long as the misalignment falls within a threshold misalignment tolerance, the integrated circuit wafer 30a is considered to be aligned with the integrated circuit wafer 30b.

FIG. 2B shows the alignment circuitry 38 schematically as being electrically connected to each integrated circuit die 32a and to each integrated circuit die 32b of integrated circuit wafers 30a, 30b. In practice, the alignment circuitry 38 will likely be electrically connected to each integrated circuit die 32a and each integrated circuit die 32b of the integrated circuit wafers 30a, 30b. The alignment circuitry 38 applies an alignment test signal to each passive circuit elements 36a of the integrated circuit wafer 30a and the corresponding passive circuit elements 36b of the integrated circuit wafer 30b. Thus, each integrated circuit die 32a of the wafer 30a is properly aligned with an integrated circuit die 32b of the integrated circuit wafer 30b.

While the alignment test signal has been described as being applied to the passive elements 36a, 36b of the dies 32a, 32b, in practice the alignment test signal is applied to contact pads on the dies 32a, 32b. The alignment test signal passes through the contact pads, metal interconnections, and possibly transistors of the integrated circuit dies 32a, 32b before reaching the passive elements 36a, 36b. There are resistances, parasitic capacitances and parasitic inductances associated with the contact pads, metal interconnections, and passive circuit elements 36a, 36b. The test response signal can be compared to an expected response signal of an equivalent LRC circuit having the resistances, parasitic capacitances and parasitic inductances, including the expected capacitance between the passive circuit elements 36a, 36b in an aligned state. If the test response signal sufficiently matches the expected response signal then alignment is achieved.

The alignment test signal applied by the alignment circuitry 38 can be an AC voltage signal at a particular frequency, a DC voltage signal, an AC frequency sweep wherein a plurality of frequency signals are applied to the integrated circuit dies 32a, 32b, or any other suitable alignment test signal. The alignment circuitry 38 can measure in the response signal a time constant of a decay rate of the response signal, an amplitude and frequency of the response signal, a resonant frequency of the circuit formed by the dies 32a, 32b, or any other suitable electrical parameters which can give an indication of the alignment of the integrated circuit wafer 30a, 30b.

After the wafers 30a, 30b are coupled together and bonded, the integrated circuit wafers 30a, 30b are simultaneously diced leaving joined pairs of integrated circuit dies 32a, 32b. The pairs of integrated circuit dies 32a, 32b are then packaged in individual integrated circuit packages.

Figure 2C:
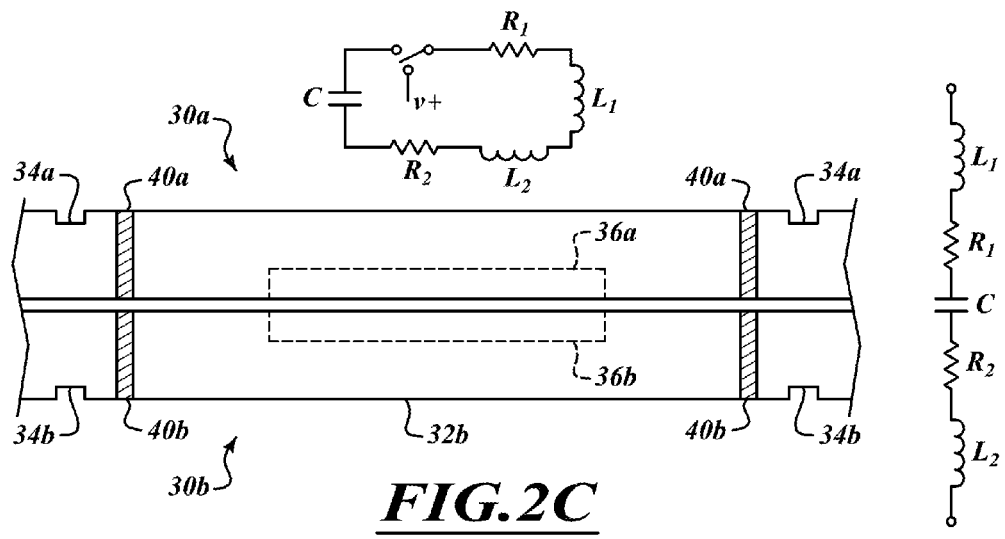
FIG. 2C is an enlarged cross section of two integrated circuit wafers during a wafer alignment process according to one embodiment.

FIG. 2C is a cross section of an integrated circuit wafer 30a and an integrated circuit wafer 30b during an alignment process, prior to coupling the integrated circuit wafer 30a to the integrated wafer 30b. The integrated circuit wafer 30a includes an individual integrated circuit die 32a bounded by scribe lines 34a and including a passive circuit element 36a at a surface of the integrated circuit wafer 30a. The integrated circuit wafer 30b likewise includes an individual integrated circuit die 32b bounded by scribe lines 34b and including a passive circuit element 36b at a surface of the integrated circuit wafer 30b. The integrated circuit wafer 30a includes through-vias 40a filled with conductive material. The integrated circuit wafer 30b includes through-vias 40b filled with conductive material. The through-vias 40a, 40b are electrically connected to respective control circuitry formed within the integrated circuit dies 32a, 32b. In FIG. 2C, the integrated circuit wafer 30a is aligned with the integrated circuit wafer 30b as is indicated by the passive circuit element 36a being vertically aligned with the passive circuit element 36b. Because the passive circuit elements 36a, 36b are aligned, the through-vias 40a are aligned with the through-vias 40b. Thus, when the integrated circuit wafer 30a is coupled to the integrated circuit wafer 30b, the through-vias 40a, 40b will be electrically connected to each other.

The alignment mechanism relies on the signal response of a LC tank circuit. As is well known, the frequency response of an LC tank circuit is as follows:

$$F_r = \frac{1}{2\pi} \times \sqrt{LC}$$

where $F_r$ is the frequency response of the signal, L is the inductance value, and C is the capacitance value. Above the integrated circuit wafers 30a, 30b, FIG. 2C shows a diagram of the LRC circuit that is created as wafers are brought into alignment according to the principles taught herein. Each of the individual die 32a, 32b contains one plate of the capacitor C. As the plates of the capacitors are brought close to each other, an LRC circuit is created similar to that shown in the top view of FIG. 2C and as also illustrated on the right hand side of the two die in FIG. 2C. With the two die 30a, 30b held directly adjacent to each other and close, but not touching, the capacitor C having a certain capacitance as obtained based on the distance between the plates and the overlap of area between the plates. Capacitance is determined according to the following formula:

$$C = \frac{kA}{d}$$

where k is the dielectric constant, A is the area of overlap, and d is the distance between the plates. The alignment is carried out by holding the plates a set distance apart from each other so that d is a constant. The dielectric constant k is also kept constant, which preferably is air, but may be other gases such as argon, nitrogen, or the like, in order to maintain the wafers in a sterile, purified environment. The area will be determined by the amount of overlap between the two plates of the capacitors. The area reaches a maximum amount when the capacitor plates are exactly aligned with each other along all edges so a maximum area of overlap between the two plates is achieved. While the distance is held at a constant, the wafers 30a, 30b are moved very slight amounts with respect to each other, which will change the area of overlap and, thus, the capacitance of the circuit as shown in FIG. 2C. The frequency response of the signal will therefore change as the area of overlap changes. With an increase in capacitance, the frequency output of the LRC circuit decreases and, with a lower capacitance the frequency response will increase. According to one test circuit, the frequency is monitored to determine the frequency response of the LRC circuit as created by having the two wafers 30a, 30b closely adjacent to each other. Slight movements are made to find that position which gives the lowest possible frequency. After the lowest possible frequency which the circuit can attain is located, then the particular dies being tested are assured of being aligned as accurately as possible.

According to one embodiment, the actual absolute value of the frequency is not so important as finding that frequency which is the lowest possible value for a given test. As will be appreciated, the exact actual capacitance may not be knowable for every circuit because of small variations which may occur in the distance between the wafers 30a, 30b, minor variations in the resistance values, the inductance values, and the size of the plates of the capacitors. However, for each circuit, for a constant distance d there will be a location at which the capacitive plates have a maximum overlap and thus a maximum capacitance. Accordingly, the plates are positioned a set distance d apart from each other and then slight movements are made of one plate relative to the other in order to locate the particular position in which the frequency is at a minimum for that particular capacitive alignment. This can be determined using a simple frequency test circuit and, since the test can be performed very quickly, a minimum frequency can be located in the first scan and then slight movement made in two or three directions to confirm that the frequency will increase with movement in any direction and refine the position to locate that position which gives the minimum possible frequency.

Figure 2D:
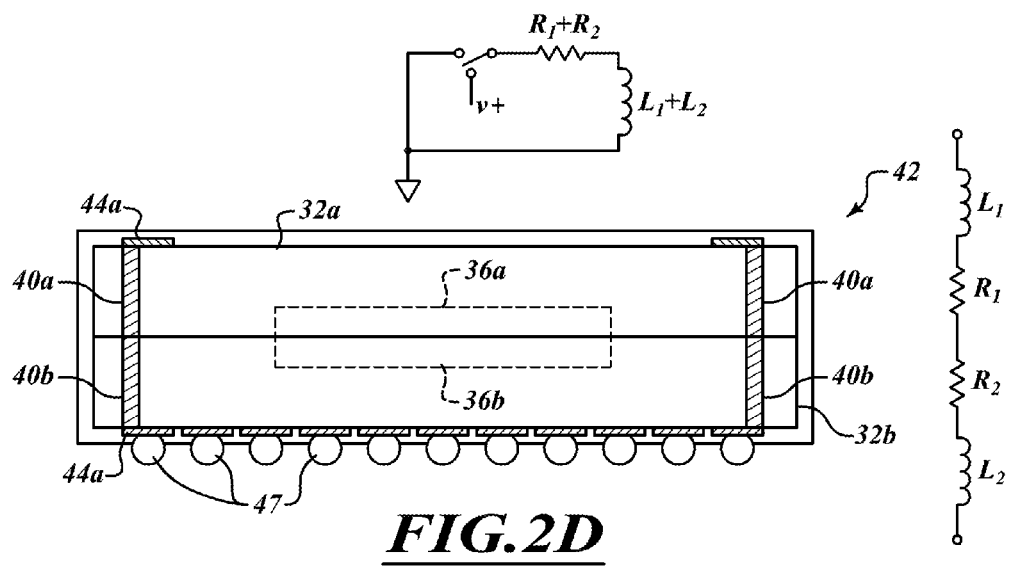
FIG. 2D is an enlarged cross section of an integrated circuit package including two aligned integrated circuit dies according to one embodiment.

The above test can be conducted for each pair of die on the entire wafer 30a, 30b to perform specific alignment on the die-to-die contact prior to touching each other. The distance d can be made sufficiently small that one pair of die, once aligned, can be pressed together to touch each other as shown in FIG. 2D and then, the adjacent pair of die can be tested to find their minimum distance. As will be appreciated, once one or more dies on a particular pair of wafers are placed in contact with each other, all other die on the wafer will likely be properly and completely aligned such that little to no movement would be needed for those individual die. However, some very small movement, in the range of nanometers or microns, may still be permitted to perfectly align some of the individual die after one or more pair of die on the wafer have been placed in contact with each other, as shown in FIG. 2D.

According to one embodiment, the alignment begins at one side of the wafer 30a, 30b and progresses laterally across the wafer. This permits perfect alignment with each pair of die as the wafer is moved minute distances to provide for any individual variations which may occur based on differences in wafer warpage, small variations in the scribe line length, or other minor variations. This also permits the die to be moved slightly at one edge only in order to fine tune the alignment for each pair of die and allows the contact between the wafers to start a one edge and move laterally across the pair of wafers to the other edge, thus slowly, more carefully, and particularly aligning the wafers with respect to each other and pushing out any discontinuities or slight changes in shape, warpage, or length which may exist between the two wafers.

On the other hand, in an alternatively embodiment, four pair of die at four difference compass locations on the wafer, such as north, south, east, and west, or if being considered as clock, 12 o'clock, 3 o'clock, 6 o'clock, and 9 o'clock, can be aligned so the four pair of dice are locked and aligned with respect to each other perfectly according to the embodiments as taught herein. Following this alignment it would be expected that the die in the center of the wafers will likely be perfectly aligned such that little to no further movement would be needed. The alignment can therefore proceed around the outer edges of the wafers 30a, 30b and, one aligned, can proceed to the inner diameters. This particular method of alignment has the benefit of more quickly aligning all of the die on the wafer, however, there is some risk that if there is a significant shape or size discontinuity between the two wafers that some of the die in the central area may not be able to be aligned with each other since, if all the die at the perimeter are aligned and touching with respect to each other while very minor movements of the die in the central location will still be possible, larger movements will be prohibited, because the perimeter of the two wafers are already locked into each other.

In yet a third embodiment, the first pair of die to be aligned can be those that are at the most central location of the two pairs of wafers and from there the alignment can proceed in a spiral pattern outward, a series of rings outward, or other acceptable technique. The third technique provides the benefit that any discontinuities between the wafers can be pressed out toward the edges so that each of the die at the edges can be perfectly aligned with each other and there will be sufficient room for minor movement by moving the edge of the wafers during the alignment process.

In one embodiment the wafers 30a, 30b are aligned by applying the test signal to each or several pairs of dies 32a, 32b and coupling the wafers 30a, 30b when the collective response signals from each of the pairs of dies exhibits particular characteristics. In such an embodiment the wafers 30a 30b are brought together and the dies 32a, 32b are brought into contact at substantially the same time after a general alignment process of the wafers has been performed. Any suitable process for aligning the wafers 30a, 30b, and the individual dies 32a, 32b can implemented in accordance to principles of the present disclosure.

Scribe lines 34a are formed on a front side of the integrated circuit wafer 30a. The front side of an integrated circuit wafer is generally defined as the side of the wafer corresponding to a side of the semiconductor layer on which transistors are formed within the integrated circuit wafer. A back side of an integrated circuit wafer is generally defined as a side of the integrated circuit wafer corresponding to a side of a semiconductor layer within the integrated circuit wafer opposite of the side on which transistors are formed. The passive circuit element 36a is therefore shown as being on a back side of the integrated circuit wafer 30a. The passive circuit element 36b is likewise shown as being on a back side of the integrated circuit wafer 30b. In practice, the passive circuit elements 36a, 36b can be formed on either the front side or the back side of the integrated circuit wafers 30a, 30b. The alignment of the wafers 30a, 30b can thus be performed by aligning back side to back side, front side to front side, or front side to back side. The integrated circuit wafers 30a, 30b can be stacked in any suitable manner.

FIG. 2D illustrates an integrated circuit package 42 including an integrated circuit die 32a and an integrated circuit die 32b. The integrated circuit die 32a and the integrated circuit die 32b were previously aligned using the passive circuit elements 36a, 36b. The integrated circuit die 32a can be bonded to the integrated circuit die 32b by placing a very thin layer of adhesive material on the surface of the integrated circuit die 32a and on the surface of the integrated circuit die 32b, and then bringing the integrated circuit die 32a into contact with the integrated circuit die 32b. Alternatively, metal-to-metal bonding can be implemented. Metal-to-metal bonding can be performed by using diffusion bonds which bond copper through-vias 40a to copper through-vias 40b. The passive circuit elements 36a, 36b can also be utilized for metal-to-metal bonding. Metal-to-metal bonding may also be performed by using eutectic bonding. Eutectic bonding uses particular alloys that change directly from solid to liquid at a unique triple point in the phase diagram. The transition to a liquid phase provides a viscous interface that can self-planarize over surface topography and particles. Any suitable method can be used to fix the first integrated circuit die 32a to the second integrated circuit die 32b.

In FIG. 2D, the through-vias 40a are electrically connected to the through-vias 40b. Redistribution lines 44a connect through-vias 40*a* to contact pads of the integrated circuit die 32*a*. The contact pads are not shown in FIG. 2D. Redistribution lines 44*b* are formed on a bottom surface of the integrated circuit die 32*b* and electrically connect through vias 40*b* to contact pads of the integrated circuit die 32*b*. While only two through-vias 40*a* and two through-vias 40*b* are shown in FIGS. 2C and 2D, in practice each integrated circuit die 32*a*, 32*b* can have dozens of through-vias 40*a*, 40*b*.

A passivation layer 46 covers the integrated circuit dies 32*a*, 32*b*. The passivation layers 46 can be any suitable passivation layer such as molding compounds, spin-on glass, silicon oxide or nitride insulating layers, or any other suitable passivation layers. While the passivation layer 46 is shown as a single passivation layer, alternatively the passivation layer 46 can include multiple layers and multiple materials including those already mentioned or any other suitable passivation layers and materials. Solder balls 47 are attached to the redistribution lines 44*b* of the integrated circuit die 32*b*. Solder balls 47 are used to connect the integrated circuit package 42 through a system or device in which it will be used. Although not shown in FIG. 2D, solder balls 47 may be placed on any distribution lines 44*a* of the integrated circuit die 32*a*. Any other suitable packaging scheme can be implemented in accordance with principles of the present disclosure.

Figure 3A:
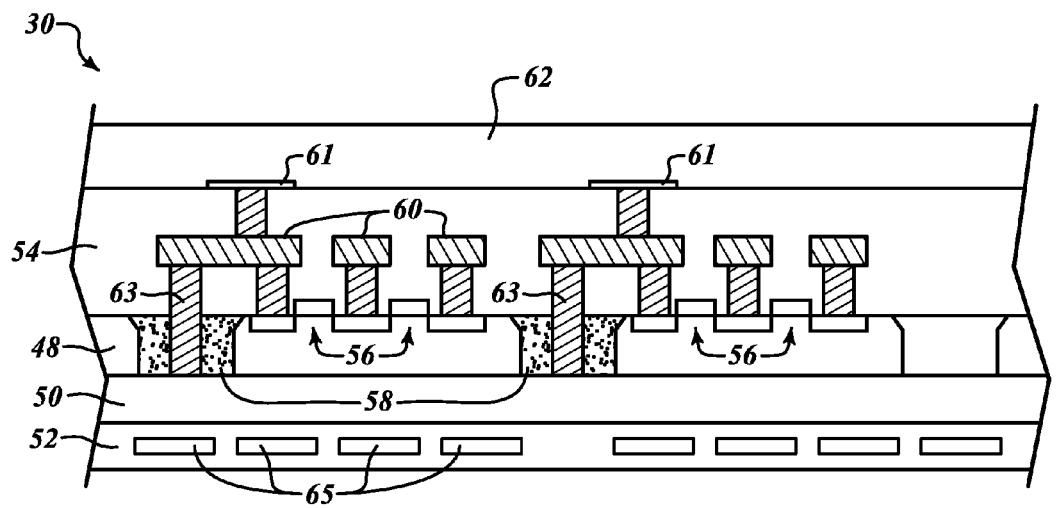
FIGS. 3A-3F is a cross section of an integrated circuit wafer including an alignment inductor at various stages of manufacture.

FIG. 3A is a cross section of an integrated circuit wafer 30 according to one embodiment. The integrated circuit wafer 30 includes a semiconductor layer 48, a buried insulating layer 50 coupled to a bottom of the semiconductor layer 48, and a bulk semiconductor layer 52 coupled to the bottom of the buried insulating layer 50. A dielectric layer 54 is on the semiconductor layer 48. Transistors 56 are formed in the semiconductor layer 48 and in the dielectric layer 54. Trench isolation regions 58 separate individual groups of transistors 56 from each other. Metal interconnection 60 including metal tracks and vias are formed in the dielectric layer 54. The metal interconnections 60 form connections to the transistors 56 and contact pads 61 of the integrated circuit wafer 30. A passivation layer 62 covers a top surface of the integrated circuit wafer 30. Metal vias 63 are formed in the trench isolation regions 58. The metal vias 63 will electrically conduct a passive circuit element 32 formed on the backside of the integrated circuit die 32 to transistors 56, described in more detail below. In an alternative embodiment a portion of the metal vias 63 can be formed in both the buried insulating layer 50 or even in the bulk semiconductor layer 52.

The integrated circuit wafer 30 shown in FIG. 3A is an SOI integrated circuit wafer 30. The semiconductor layers 48, 52, the buried insulating layer 50, the transistors 56, the dielectric layer 54 and the metal interconnections 60 can all be formed according to conventional processes for forming such layers and structures in an integrated circuit wafer 30. While FIG. 3A illustrates metal interconnection 60 of a single metal layer, in practice there are many metal interconnection layers, for example up to twelve metal layers. Only one metal layer is shown in FIG. 3A for simplicity.

Reference is made to U.S. Pat. No. 7,531,407 which describes formation of backside inductors in SOI wafers in detail and is hereby incorporated by reference. U.S. patent application Ser. No. 12/650,372 details alignment testing using resistive means and is hereby incorporated by reference. The inductor may be used for testing alignment as will be described in further detail in relation to FIG. 4.

Figure 3B:
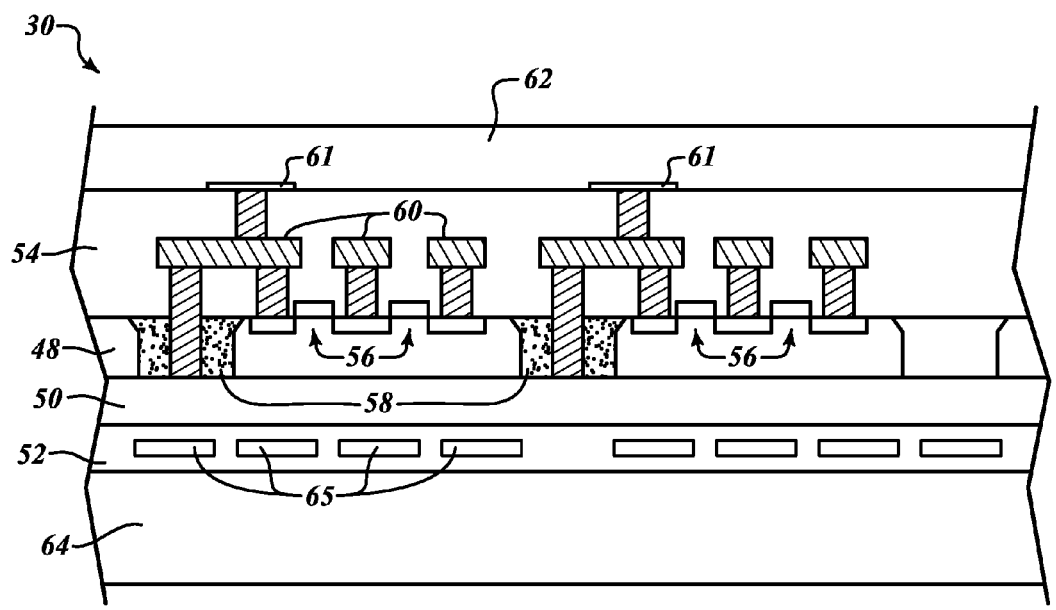

In FIG. 3B a backside insulating layer 64 is formed on the semiconductor layer 52. The backside insulating layer 64 is, for example, a dielectric material such as silicon dioxide, silicon nitride, phosphosilicate glass, spin-on glass, silicon nitride, or any other suitable layer or layers of insulating material. The backside insulation layer 64 is, for example, between 10, 100 microns thick. A ground plane 65 is also formed in the bulk silicon layer 52. The ground plane is formed by doping selected isolated regions of the bulk semiconductor layer 52 with impurity atoms to make the selected regions of the bulk semiconductor layer 52 conductive. Alternatively the ground plane 65 can be formed using any other suitable materials and processes. The ground plane 65 includes a plurality of isolated conductive regions in the bulk semiconductor layer 52. The ground plane 65 inhibits electrical interference from conductive devices formed in the backside insulating layer 64 from interfering with the transistors 56 in the semiconductor layer 48. Further details regarding the formation of the ground plane 65 is illustrated in U.S. Pat. No. 7,531,407, previously incorporated by reference herein.

Figure 3C:
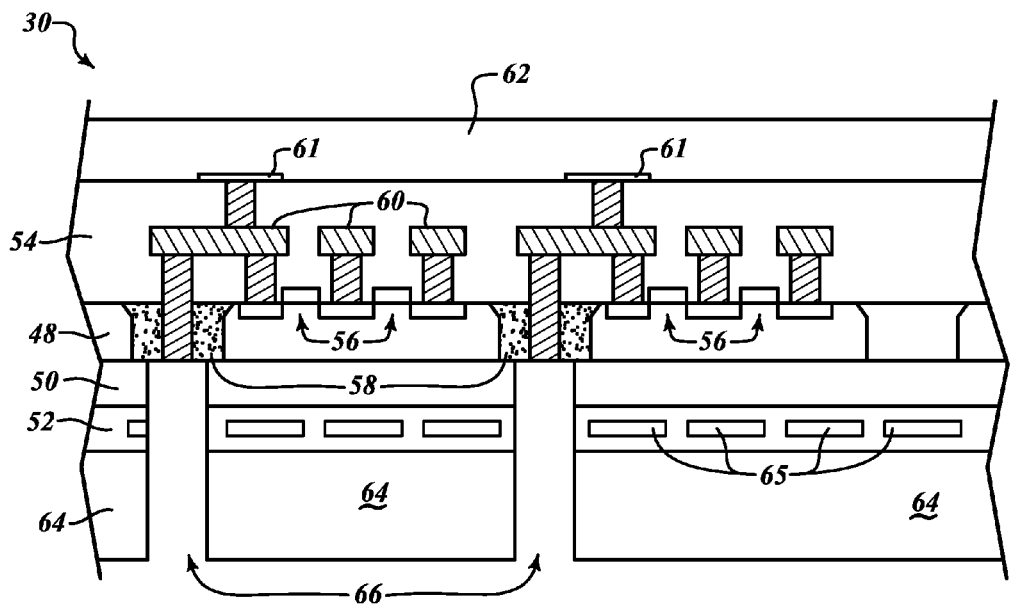

In FIG. 3C, backside contact via holes 66 are formed through the backside insulation layer 64, the bulk silicon layer 52, and the buried insulation layer 50. The backside contact via holes 66 expose portions of contact vias 63 and trench isolation regions 58. The backside contact via holes 66 may be formed using known photolithographic methods wherein a photoresist mask pattern is formed having openings that define the backside contact via holes 66 that are aligned with the contact vias 63. The backside contact via holes 66 will electrically connect contact vias 63 with a passive circuit element 36 that will be formed in the backside insulation layer 64 as described further herein.

Figure 3D:
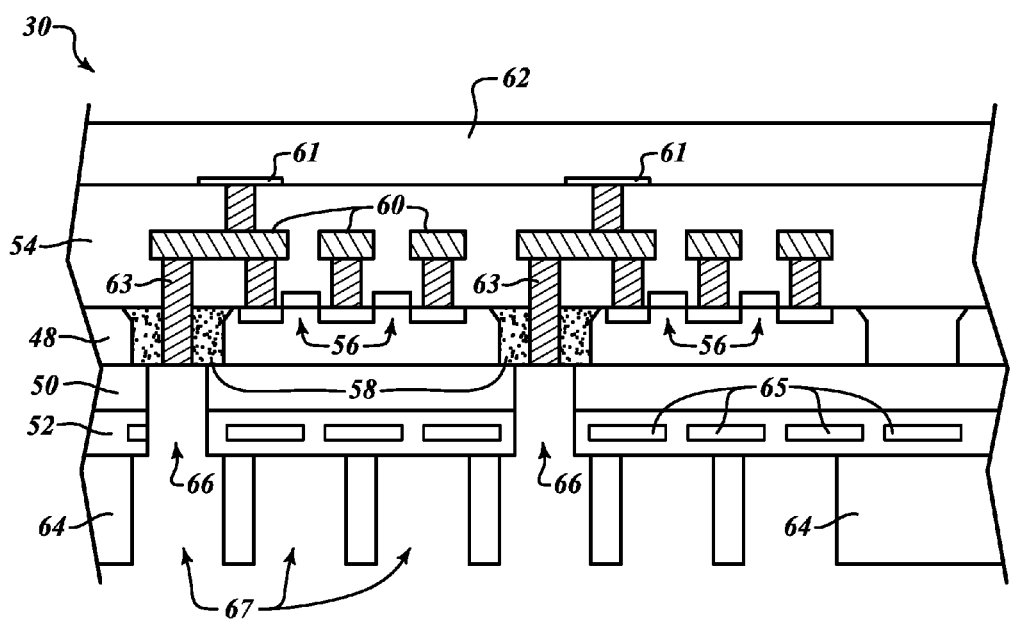
Figure 3E:
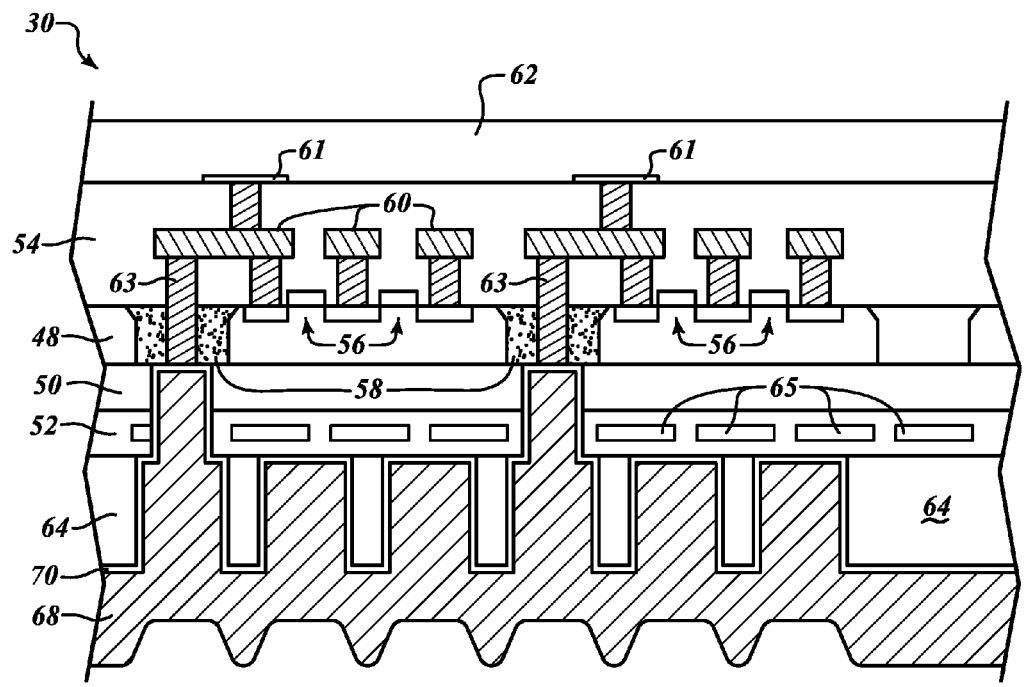

In FIG. 3D, backside inductor trenches 67 are formed in the backside insulation layer 64. The backside inductor trenches 67 are formed using conventional photolithography methods. Two of the backside inductor trenches 67 correspond to backside contact via holes 66. In FIG. 3E, a conformal conductive barrier layer 70 is formed over the backside insulating layer and the exposed sidewalls and bottom surfaces of the backside contact via holes 66 and the backside inductor trenches 67. The barrier layer 70 may include a first barrier layer which prevents migration of conductive material into the backside insulating layer 64, the bulk semiconductor layer 52, and the buried insulating layer 50. The barrier layer 70 may be formed by depositing one or more conformal layers of tantalum nitride, titanium nitride, or a single layer of titanium nitride deposited by physical vapor deposition, chemical vapor deposition, or any other suitable method. Any suitable material may be used for the barrier layer 70. A metallic material 68 is deposited in the backside contact via holes 66 and in the backside inductor trench holes 67 over the barrier layer 70. The metallic material is, for example, tungsten, aluminum, copper, alloys of those materials, or any other suitable conductive material having relatively low resistivity so as to form a high Q inductor with high performance. Prior to deposition of the conductive material 68, a thin conformal metallic seed layer is formed on the barrier layer 70 to facilitate metal plating or adhesion of the conductive material 68.

Figure 3F:
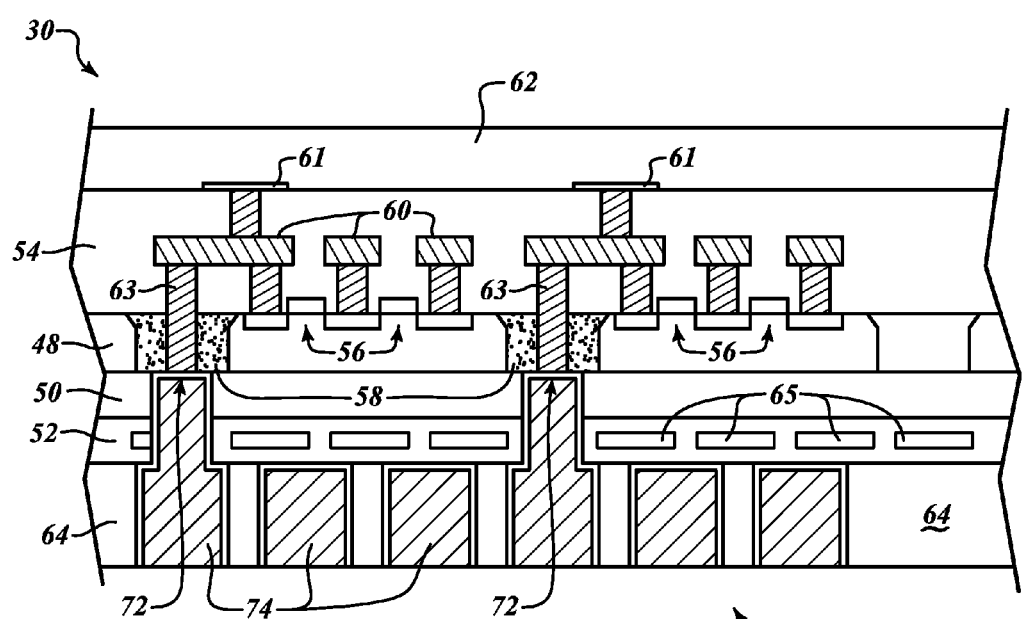

In FIG. 3F, a chemical mechanical planarization process is performed to remove the excess metal 68 and the barrier layer 70 from the back surface of the backside insulating layer 64. This leaves a high Q inductor 36 formed of individual windings 74. The inductor 36 is electrically connected to contact vias 63 at contact regions 72*a*, 72*b*. The windings 74 of the high Q inductor 36 are exposed on the backside surface of the integrated circuit wafer 30. The inductor 36 can be used to align an integrated circuit wafer 30 with a second integrated circuit wafer to which it will be attached, as described previously.

Figure 4:
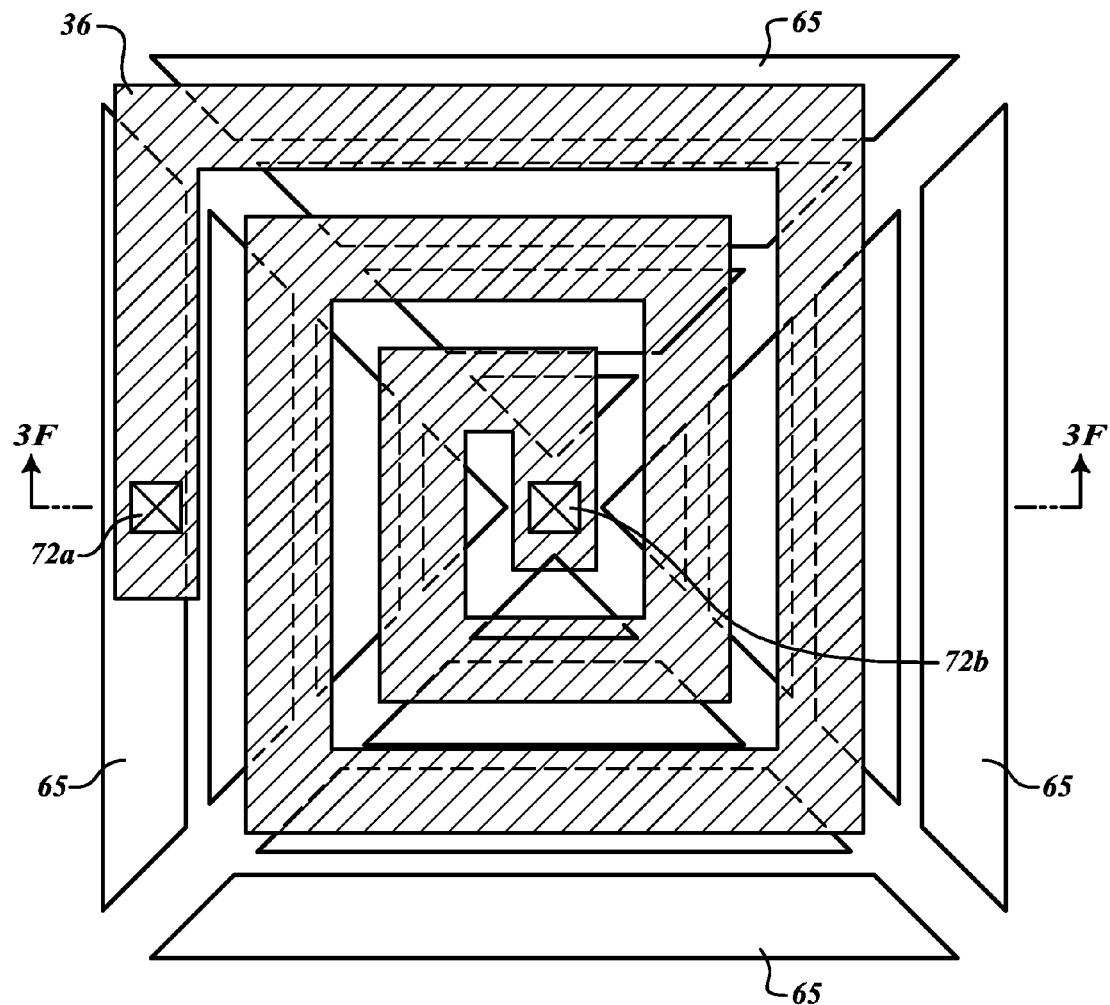
FIG. 4 is a top view of an inductor formed in an integrated circuit according to one embodiment.

FIG. 4 is a top view of the exposed portions of the inductor 36 on the surface of the backside insulating layer 64 of the integrated circuit wafer 30. The ground plane 65 is shown below the inductor 36. FIG. 3F is a cross section corresponds to a cross section taken along the lines 3F in FIG. 4.

The inductor 36 of FIG. 4 is wound in a spiral pattern and includes contact regions 72a, 72b through which the inductor 36 is coupled to contact vias 63 of the integrated circuit wafer 30. The inductor 36 is used to align the integrated circuit wafer 30 with a second integrated circuit wafer by vertically aligning the inductor 36 with a matching inductor on the second integrated circuit wafer. When the inductor 36 is aligned with the matching inductor, then the integrated circuit wafer 30 is brought into contact with the second integrated circuit wafer, as described previously. In practice, the inductor 36 can include many more windings than shown in FIG. 3F and FIG. 4. The inductor 36 may use a relatively large portion of the surface area of the back side of an individual integrated circuit die 32 or the inductor 36 may take up a relatively small portion of the surface area of the back side of an individual integrated circuit die 32. The larger the surface area of the inductor, the easier alignment will be because a relatively small vertical misalignment will result in a relatively large decrease in the capacitance between the alignment inductors. If the surface area of the inductor 36 is smaller, then a relatively small misalignment will result in a very small change in the capacitance between alignment inductors. Larger changes in capacitance are much easier to accurately detect. Therefore, larger inductors 36 allow for more accurate alignment.

The ground plane 65 shields the semiconductor layer 48, the transistors 56, and interconnections 60 from electric and magnetic field effects induced by the inductor 36. The ground plane 65 includes a plurality of electrically isolated segments. This prevents large eddy currents from forming in the ground plane 65. Such large eddy currents can also affect the semiconductor layer 48, the transistors 56, and the interconnections 60. The ground plane 65 therefore helps to minimize electrical coupling and crosstalk between the inductor 36 and the semiconductor layer 48, the transistors 56, and the interconnections 60. The ground plane 65 can include any suitable shape and size.

Figure 5A:
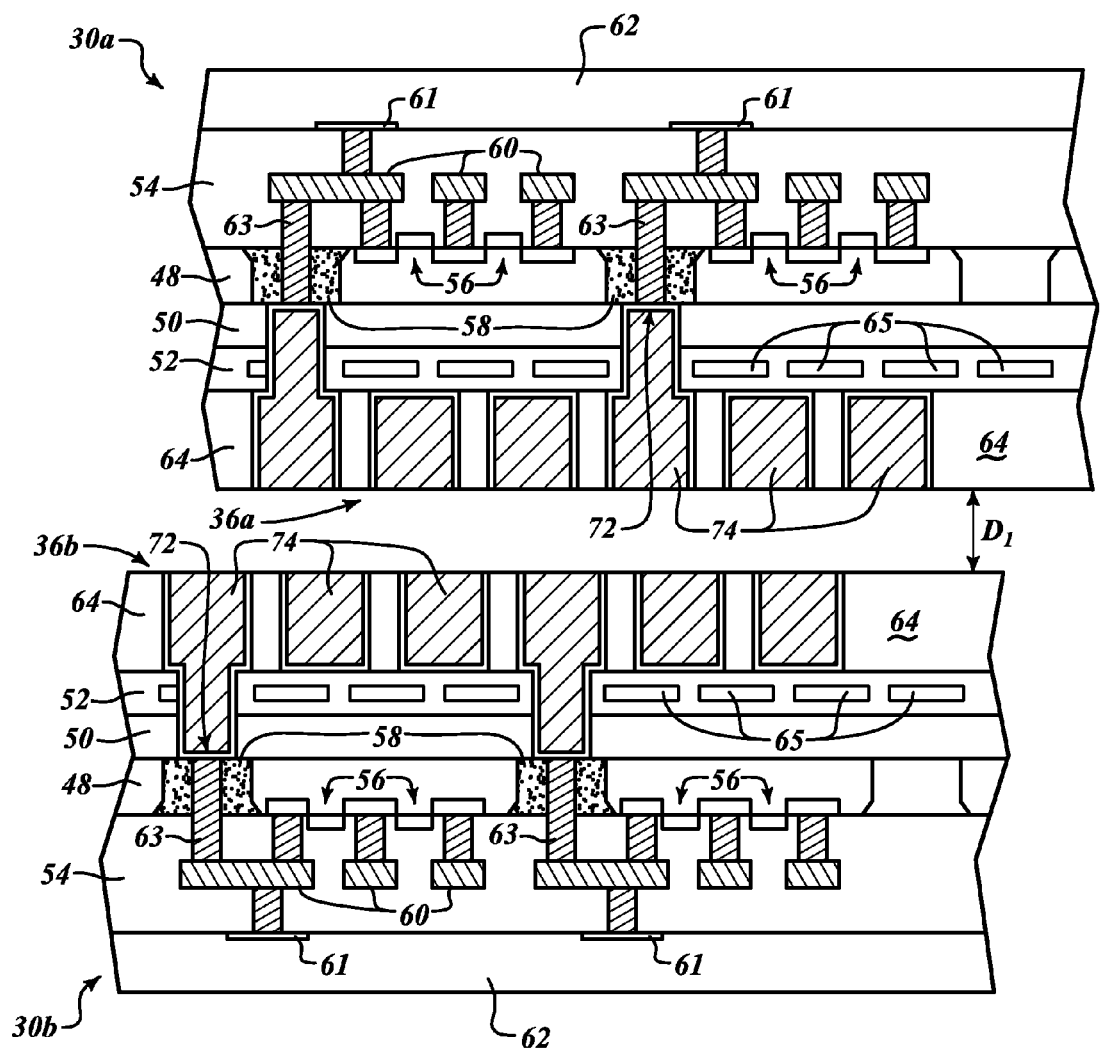
FIGS. 5A-5E is a cross section two integrated circuit wafers at various stages of an alignment process according to one embodiment.

FIGS. 5A-5E illustrate a process for aligning a first integrated circuit wafer 30a with a second integrated circuit wafer 30b using alignment inductors 36a, 36b, according to one embodiment. The integrated circuit wafer 30a includes an inductor 36a substantially identical to the inductor shown in FIG. 3F. Integrated circuit wafer 30b includes a matching inductor 36b. In FIG. 5A the alignment process begins by bringing the integrated circuit wafer 30a a fixed difference D1 from integrated circuit wafer 30b. The fixed distance D1 is in one example 1 mm. There is a vertical misalignment between inductors 36a, 36b. When an alignment test signal is passed between inductors 36a, 36b a response signal from the inductors 36a, 36b indicates a lower than expected capacitance between the inductors 36a, 36b. The capacitance between the inductors 36a, 36b is proportional to the amount of lateral overlap of the conductive surface of the windings 74 of the inductors 36a, 36b. The maximum overlap of surface area of the inductors 36a, 36b occurs when the inductors 36a, 36b are perfectly aligned vertically. The response signal indicates misalignment of the inductors 36a, 36b.

Figure 5B:
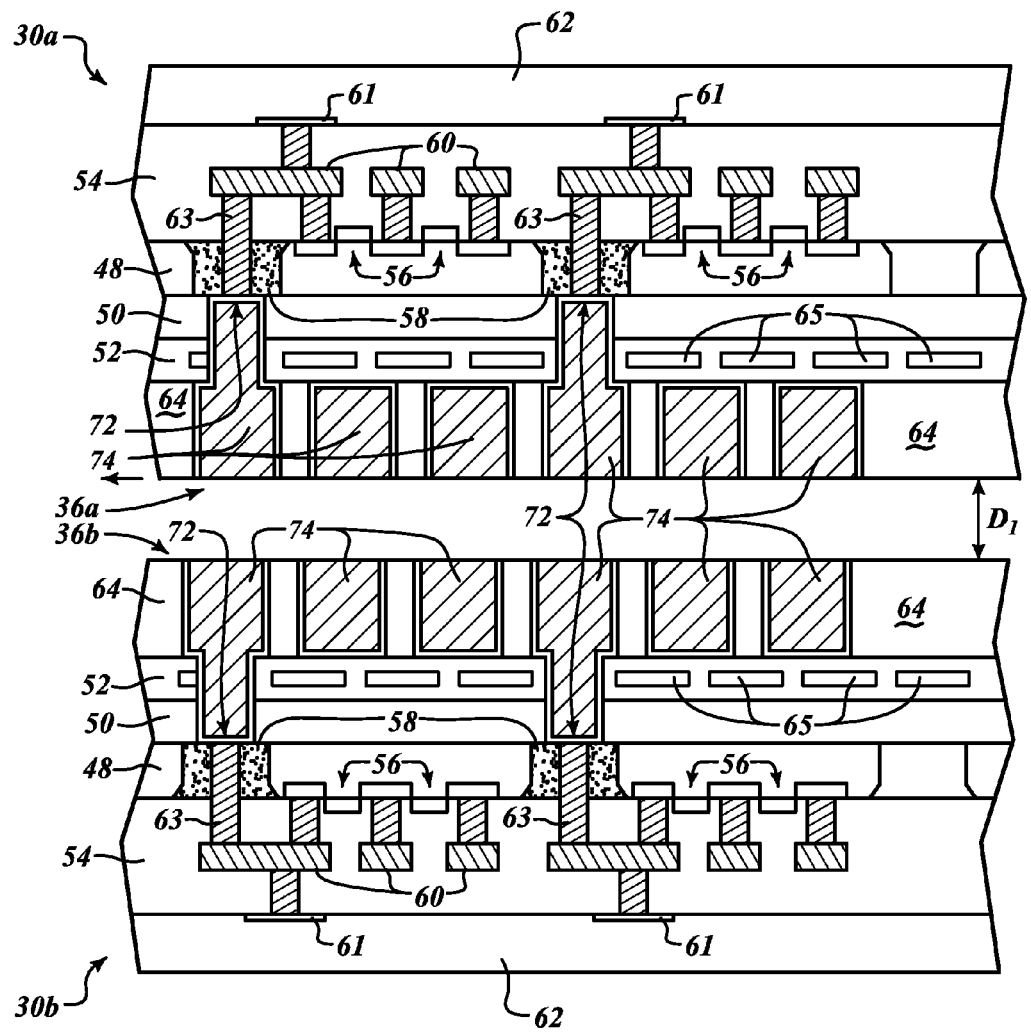
Figure 5C:
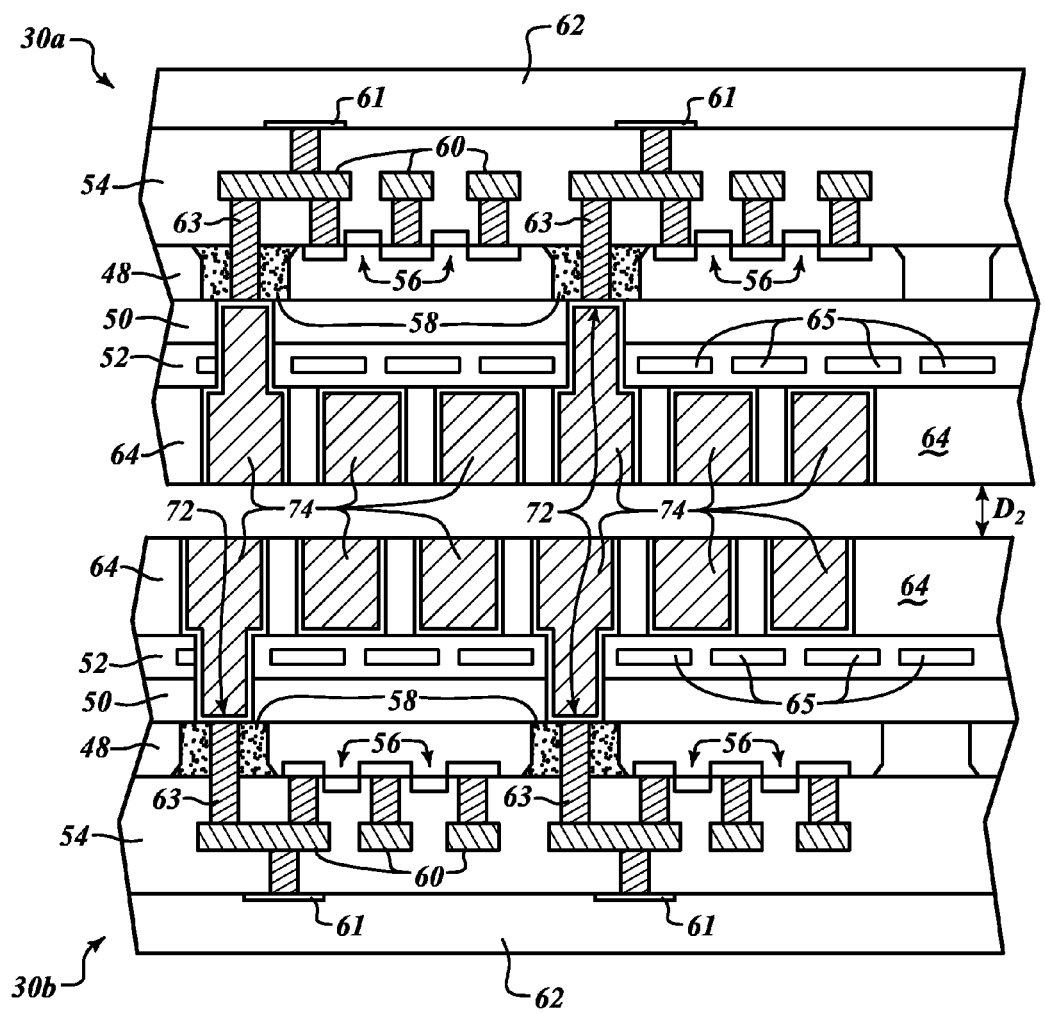

In FIG. 5B the integrated circuit wafer 30a is translated laterally to correct the vertical misalignment between the inductors 36a, 36b. The inductors 36a, 36b are still held the fixed distance D1 separating each other. The alignment test signal is passed between the inductors 36a, 36b a second time. The response signal from the inductors 36a, 36b indicates better alignment between the inductors 36a, 36b. The capacitance has increased because there is a larger lateral overlap between the windings 74 of the inductor 36a with the windings 74 of the inductor 36b. Because alignment has improved to fall within a threshold misalignment, the integrated circuit wafer 30a is brought to a fixed vertical distance D2 from the integrated circuit wafer 30b as shown in FIG. 5C. The fixed distance D2 is, for example, 1 mm. The alignment test signal is again passed between the inductors 36a, 36b. The alignment test signal used at distance D2 can be the same or different from the alignment test signal used at distance D1. The response signal is measured and indicates that there is misalignment between the inductors 36a, 36b exceeding a threshold misalignment for the fixed distance D2.

Figure 5D:
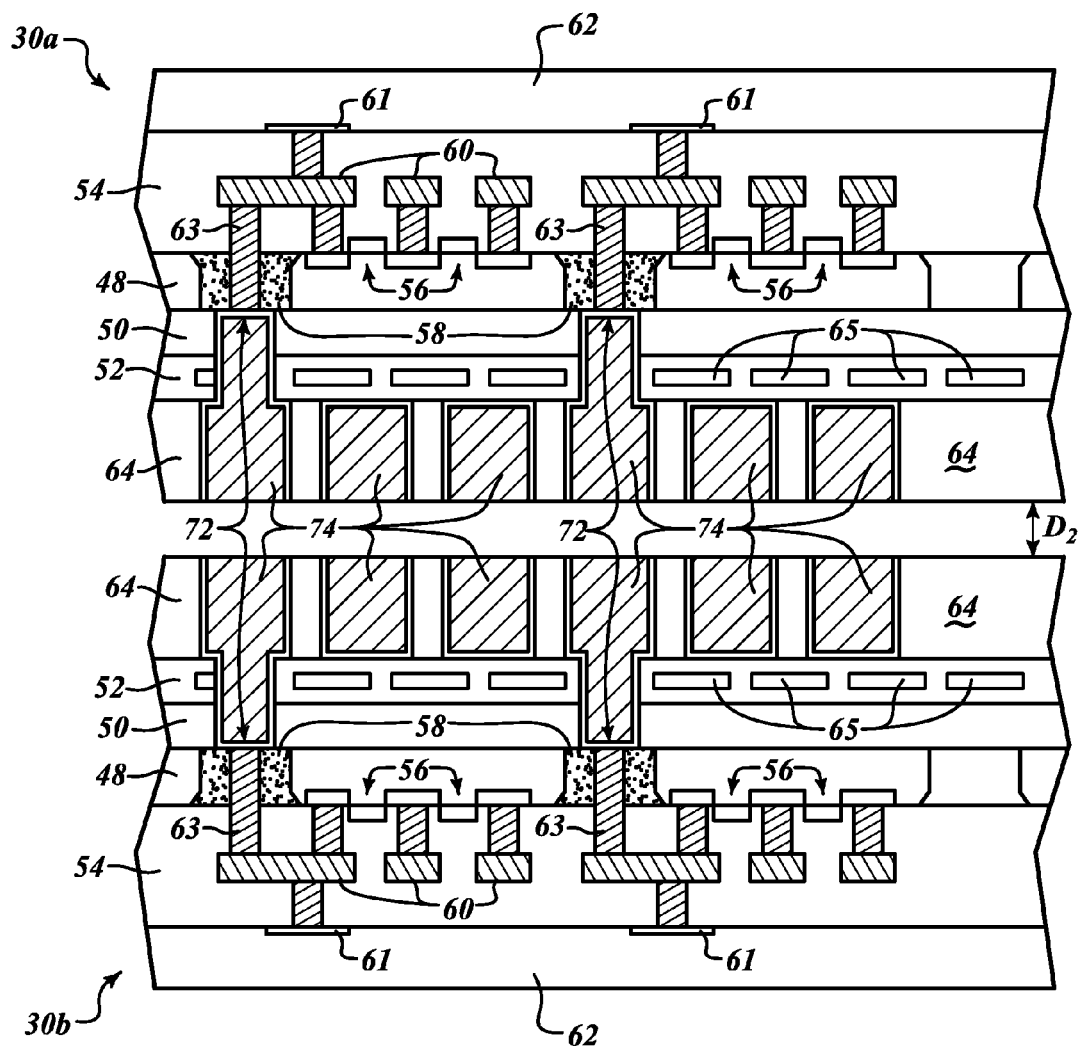
Figure 5E:
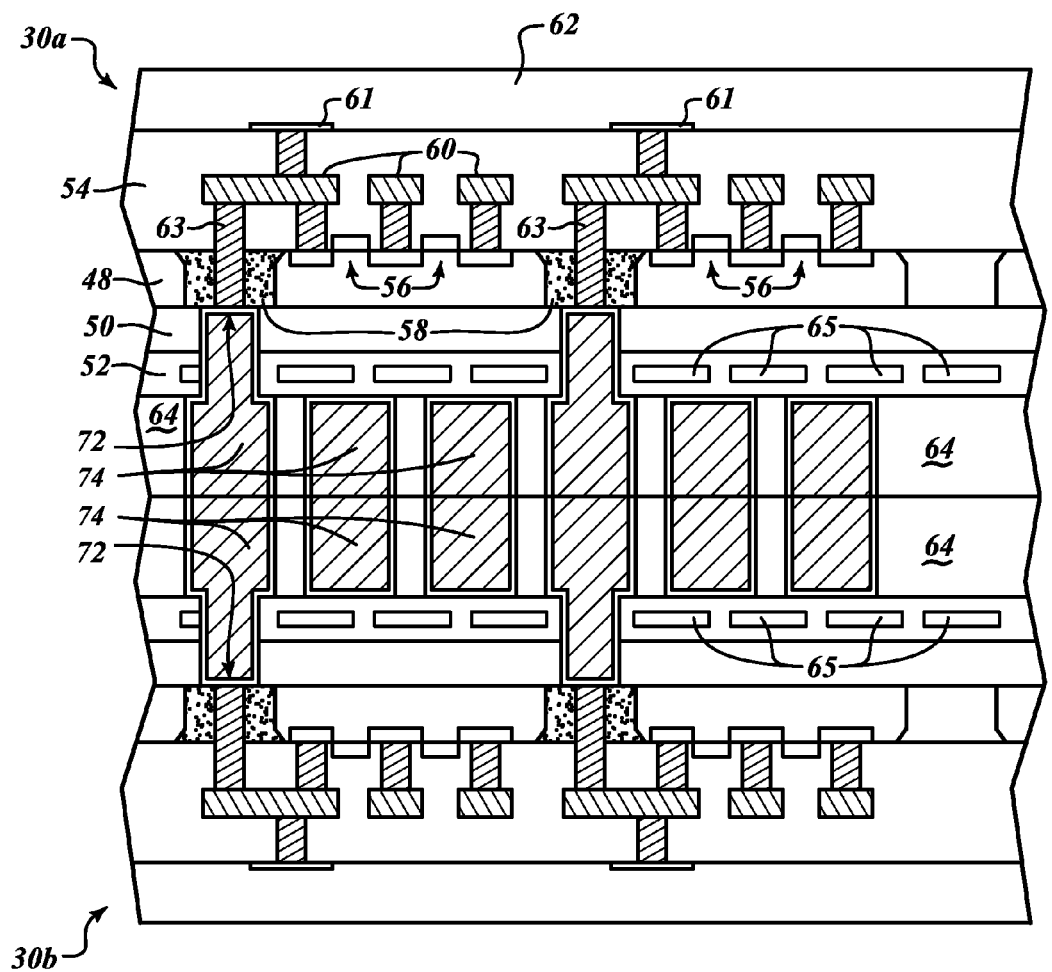

In FIG. 5D, the lateral position of the integrated circuit wafer 30a is adjusted relative to the integrated circuit wafer 30b. An alignment test signal is again applied between inductors 36a, 36b. The alignment test signal indicates that the inductors 36a, 36b are aligned within a threshold misalignment. In FIG. 5E the integrated circuit wafer 30a and the integrated circuit wafer 30b are brought into contact with each other. The inductors 36a, 36b are substantially aligned with each other. An alignment test signal passed between the inductors 36a, 36b now indicates that there is no capacitance between the inductors 36a, 36b, but instead the response signal indicates an equivalent circuit of an LR circuit rather than an LRC circuit. This indicates to the test circuitry 38 that the integrated circuit wafers 30a, 30b are in contact with each other and that alignment has occurred.

The expected response signal for each test alignment depends on the fixed vertical distance between the integrated circuit wafers 30a, 30b. The first fixed vertical distance D1 is, for example, 2 mm. The expected test response signal indicating satisfactory alignment for that fixed vertical distance is different than the expected response signal for a satisfactory alignment at distance D2, which is 1 mm. After each incremental decrease in the vertical distance between the integrated circuit wafer 30a and the integrated circuit wafer 30b, the expected response signal is adjusted according to the new distance. In practice there may be many more than two different fixed distances at which alignment test signals are applied. Furthermore, the distances at which the alignment test signals are applied may be different as well as the increments by which the vertical distances are decreased may be other than described. Any suitable schemes may be used to align the wafers vertically and to decrease incrementally the vertical distance between the wafers may be used in accordance with principals of the present disclosure. All such different schemes and methods for aligning the wafers fall within the scope of the present disclosure.

The inductor 36 formed of portions in the first semiconductor die 32a and second semiconductor die 32b can be used for purposes other than for alignment. The inductor 36 can be used as the inductor for an RF circuit application. The inductor 36 can be used as part of an RF antenna, an RFID circuit, or any other suitable application beyond alignment of the wafers 30a, 30b.

Figure 6:
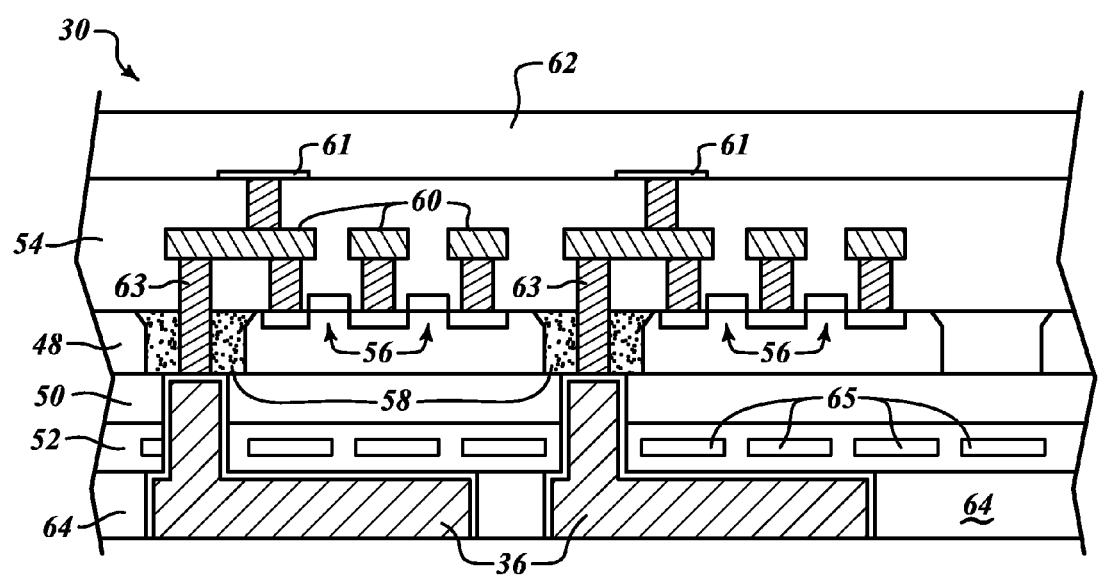
FIG. 6 is a cross section of an integrated circuit wafer including capacitor plates according to one embodiment.

FIG. 6 illustrates a cross section of an integrated circuit wafer 30 according to one embodiment. The passive circuit element 36 in FIG. 6 is a plate of a capacitor rather than an inductor coil. The capacitor plates 36 may be formed according to the same processes used to form the inductor coils as described in relation to FIGS. 3A to 3F.

Figure 7:
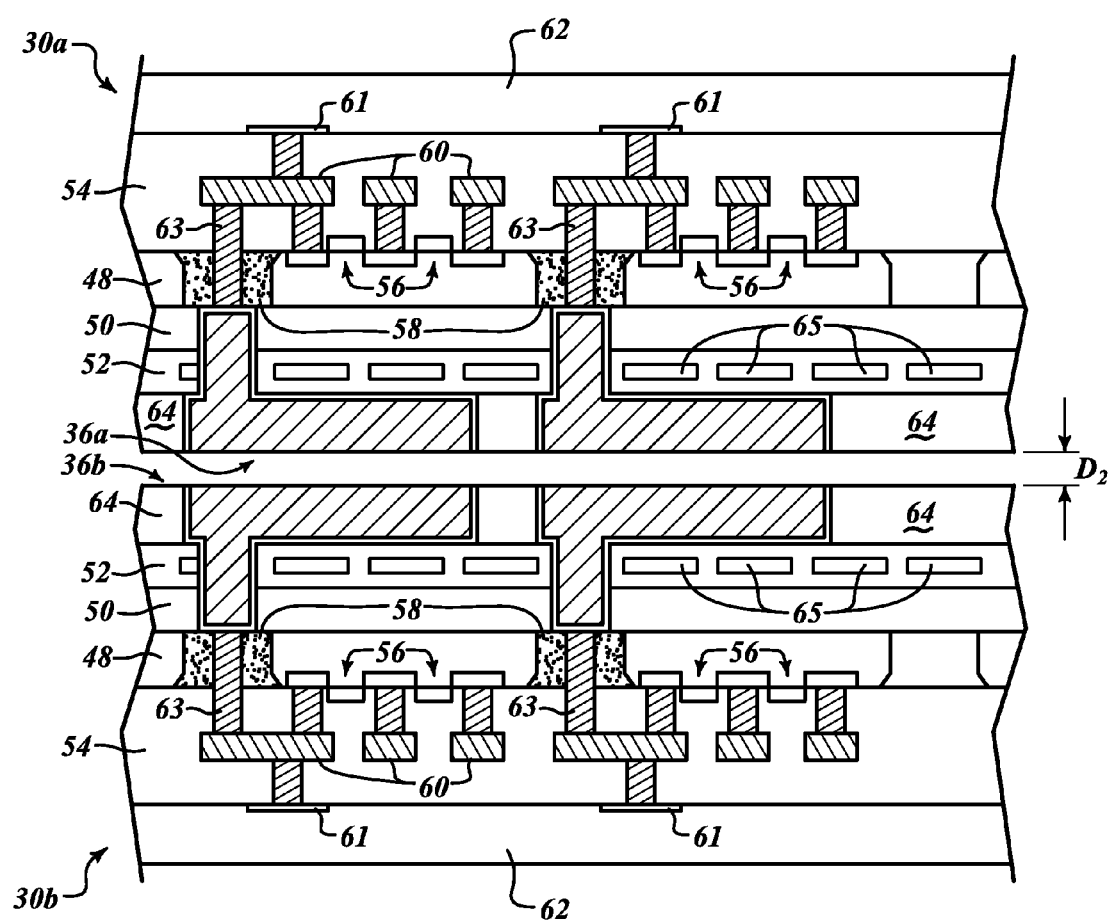
FIG. 7 is a cross section of a two integrated circuit wafers during an alignment process according to one embodiment.

FIG. 7 illustrates an alignment process in which a first integrated circuit wafer 30a has capacitor plates 36a on a backside surface thereof, and integrated circuit wafer 30b has capacitor plates 36b on the backside surface thereof. In FIG. 7 the integrated circuit wafers 30a, 30b are at fixed distance D2 and have already been brought into lateral alignment. Because there is no inductor in FIG. 7, the response signal of the capacitor plates 36a, 36b will be that of an RC circuit rather than an LRC circuit. In the same manner as previously described, alignment or misalignment of the capacitor plates 36a, 36b is based on a capacitance between the plates 36a, 36b as indicated by the response signal. If the response signal indicates that the capacitance is less than expected, then lateral adjustment occurs and an alignment test signal is again passed through the capacitor plates 36a, 36b, until the response signal indicates satisfactory alignment for the fixed vertical distance D2. Once satisfactory alignment has occurred, the integrated circuit wafer 30a and integrated circuit wafer 30b are brought into contact and fixed together.

Figure 8:
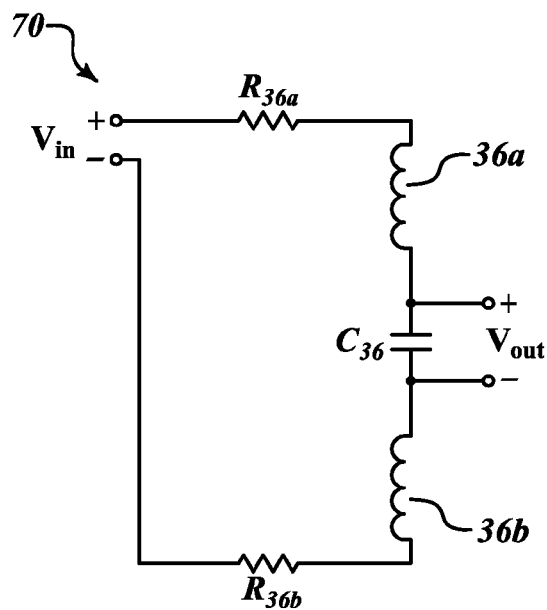
FIG. 8 is a schematic of an equivalent circuit for two integrated circuit wafers each including a respective alignment inductor according to one embodiment.

FIG. 8 illustrates a schematic of an equivalent circuit to the circuit through which the alignment circuitry passes the alignment test signal. The equivalent circuit 76 includes the inductor 36a of the integrated circuit wafer 30a, the series resistance $R_{36a}$ which is the internal resistance of the inductor 36a as well as the resistance in the interconnection circuitry that connects the alignment circuitry 38 to the inductor 36a. Inductor 36b is the inductor formed on the integrated circuit wafer 30b. $R_{36b}$ is the series resistance associated with the inductor 36b and the interconnections connecting the inductor 36b through the alignment circuitry. The capacitor $C_{36}$ represents the capacitance between the inductors 36a, 36b during the alignment process. The capacitor $C_{36}$ is the capacitance between overlapping conductive portions of the inductors 36a, 36b as described previously. The alignment test signal is input at input $V_{in}$. The response signal is read at the output $V_{out}$. As the integrated circuit wafers 30a, 30b are brought closer and closer during the alignment process and as they are adjusted laterally, the capacitor $C_{36}$ changes value, generally increasing throughout the alignment process. This causes the response signal to also change throughout all of the alignment process. Alignment is complete when the first integrated circuit wafer and the second integrated circuit wafer come into contact. When the first and second integrated circuit wafers come into contact, the inductors 36a, 36b come into electrical contact and the capacitance $C_{36}$ disappears because the inductors 36a, 36b are shorted together.

Figure 9:
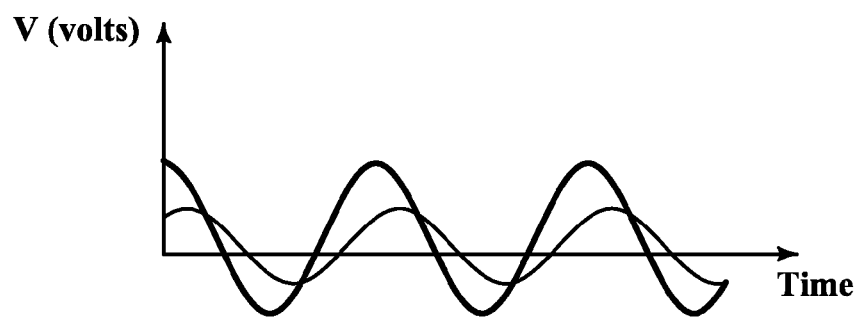
FIG. 9 is a graph of an input alignment signal and an output response signal according to one embodiment.

FIG. 9 is a graph of the alignment test signal and the test response signal. In FIG. 9, the alignment test signal is an alternating voltage signal of a given frequency and amplitude. The test response signal is attenuated and out of phase with the alignment signal. The amplitude and phase of the test response signal changes according to alignment of the inductors 36a, 36b. By analyzing the test response signal, the alignment circuitry 38 can give an indication of the vertical alignment of the inductors 36a, 36b. Any suitable alignment test signal may be used as described previously. The alignment test signal can simply be an input DC signal which is subsequently removed and the response signal can simply monitor a decay rate of the output signal which is an indication of the time constant of the RLC circuit which is a further indication of the capacitance between the inductors 36. Alternatively, an AC sweep can be performed in which a series of differing frequency signals can be applied at the inputs $V_{in}$ and the resonant frequency of the RLC circuit can be determined by monitoring the response signal at $V_{out}$ during the AC sweep. In an embodiment in which the passive circuit element is a capacitor rather than an inductor, the equivalent circuit shown in FIG. 8 will be an RC circuit rather than an RLC circuit. There are many ways in which an alignment circuit can be implemented in accordance with principles of the present disclosure. All such methods, schemes, and structures, fall within the scope of the present disclosure.

Figure 10:
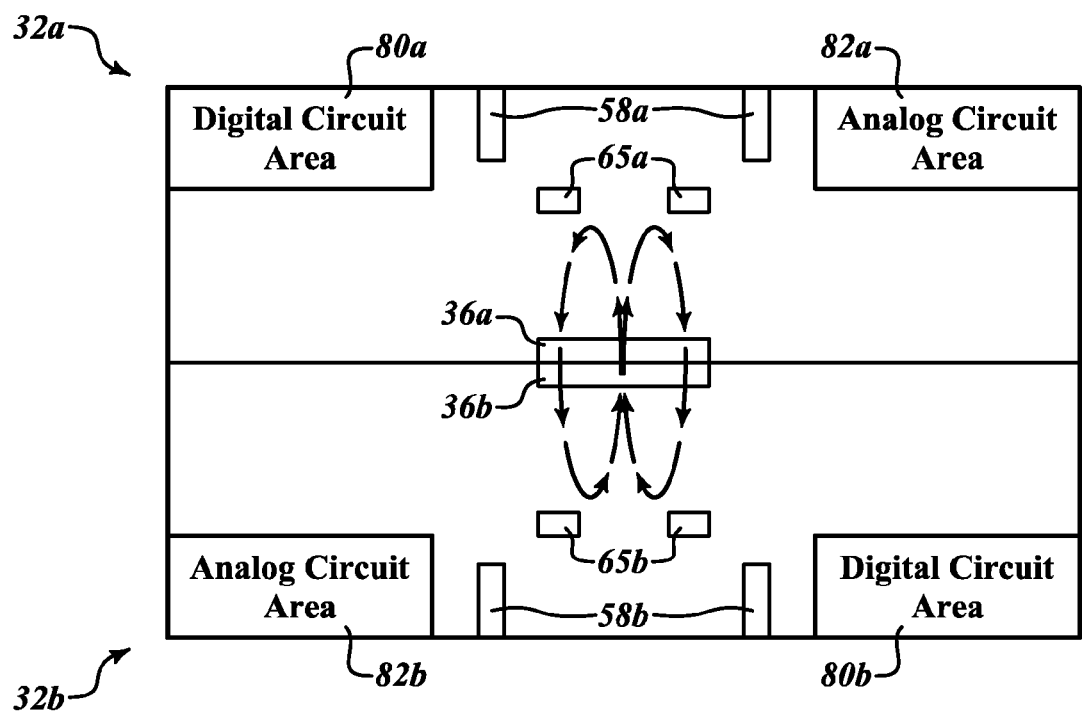
FIG. 10 is a cross section of an integrated circuit package including an inductor according to one embodiment.

FIG. 10 is a simplified cross section of an integrated circuit package 42 according to one embodiment. The integrated circuit package 42 includes first and second integrated circuit dies 32a, 32b coupled together. Each integrated circuit die 32a, 32b includes a respective digital circuit area 80a, 80b, a respective analog circuit area 82a, 82b, trench isolations 58a, 58b, alignment inductors 36a, 36b, and ground planes 65a, 65b. The alignment inductors 36a, 36b are electrically connected and form a single inductor.

A current is passed through the inductors 36a, 36b. The current passing through the inductors 36a, 36b generates a magnetic field. The magnetic field provides further isolation between the digital and analog circuit components within each die. A free charge carrier from the digital circuit area 80a cannot pass through to the analog circuit area 82a because the trench isolations 58a, and the magnetic field from the inductors 36a, 36b prevent the charge carrier from passing through. For example, an electron passing from the digital circuit area 80a will become trapped in the magnetic field from the inductors 36a, 36b. A moving charge carrier in the presence of a magnetic field will be forced to move in a circular pattern. Thus a free charge carrier from any of the digital circuit or analog circuit areas 80a, 80b, 82a, 82b will become trapped by the magnetic field from the inductors 36a, 36b.

The inductors 36a, 36b will generate a magnetic field anytime a current is passed through them. Thus the inductors 36a, 36b can be utilized to suppress cross talk between circuit elements at any desired time by passing a current through the inductors 36a, 36b. The magnetic field can be generated continuously, or intermittently as desired.

Figure 11:
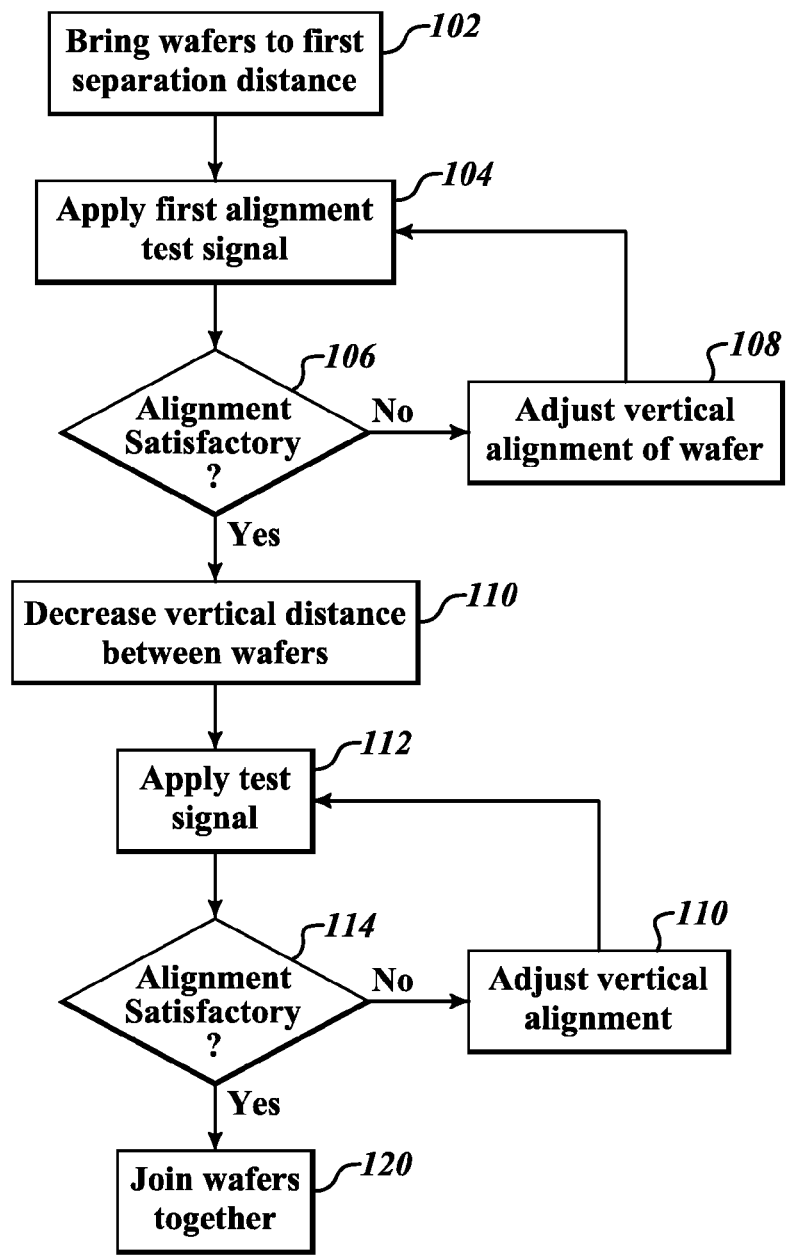
FIG. 11 is a flow diagram of a wafer alignment process according to one embodiment.

FIG. 11 is a process flow for aligning a first integrated circuit 30a with a second integrated circuit wafer 30b and joining them together. At 102, wafers 30a, 30b are brought into proximity with each other, separated by a first fixed vertical separation distance. At 104, an alignment test signal is applied to the inductors 36a, 36b of the wafers 30a, 30b. At 106, the response signal of the inductors 36a, 36b is measured to determine if alignment is satisfactory for the first separation distance. If the response signal as measured by the alignment circuit 38 indicates that alignment is not satisfactory or that the misalignment falls outside of a threshold misalignment tolerance, then the vertical alignment of the inductors 36a, 36b is adjusted at 108 by laterally translating the wafer 30a. After the vertical alignment of the inductors 36a, 36b is adjusted, the alignment test signal is again applied at 104. At 106, if the response signal as measured by the alignment circuit 38 indicates that alignment is satisfactory, then at 110 the vertical distance between wafers 30a, 30b is closed to a second smaller distance D2. After closing the separation distance to distance D2, at 112 the alignment test signal is again applied to the inductors 36a, 36b. At 114, the alignment circuitry 38 analyzes the response signal to check if alignment falls within a misalignment tolerance threshold. If alignment falls outside the misalignment threshold, then at 116 the vertical alignment of the wafers 30a, 30b is adjusted by laterally translating the wafer 30a. The alignment test signal is applied again at 112 and the response signal is measured again at 114. If the measured response signal indicates that satisfactory alignment has occurred for the second distance separation, then the distance between the wafers 30a, 30b is closed again and the wafers 30a, 30b are joined together at 120. After the wafers are joined together at 120, the alignment test signal is again applied. The response signal now indicates that the capacitance component of the equivalent circuit is now gone and an LR circuit remains. The test circuitry 38 determines that alignment is achieved and that the wafers are in contact. While three steps of decreasing the vertical distance between the wafers are described in relation to the process of FIG. 10, in practice many more steps of closing the vertical distance and adjusting the lateral alignment may be involved. For instance, the first distance separation may be 3 mm and each successive decrease in vertical distance may be a decrease of 0.5 mm. Alternatively, the initial separation distance is on the order of tens or hundreds of microns. Any suitable scheme for adjusting the lateral alignment, decreasing the vertical distance, applying alignment test signals, and reading response signals can be used and fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
 a first integrated circuit die including:
  a first semiconductor layer;
  a first dielectric layer on the first semiconductor layer;
  a first inductor coil in the first dielectric layer; and
 a second integrated circuit die coupled to the first integrated circuit die, the second integrated circuit die including:
  a second semiconductor layer;
  a second dielectric layer on the second semiconductor layer; and
  a second inductor coil in the second dielectric layer, the first inductor coil in direct physical and electrical contact with the second inductor coil.

2. The device of claim 1 wherein the first dielectric layer is on a back side of the first semiconductor layer.

3. The device of claim 1 wherein the first dielectric layer is on a front side of the first semiconductor layer.

4. The device of claim 1 wherein the first inductor is aligned with the second inductor.

5. The device of claim 1 wherein the first integrated circuit die is a SOI integrated circuit die comprising:
 a buried insulating layer adjacent to the first semiconductor layer; and
 a third semiconductor layer adjacent to the buried insulator layer opposite the first semiconductor layer, the buried insulator layer separating the first semiconductor layer from the third semiconductor layer.

6. The device of claim 5 comprising:
 a transistor formed on the third semiconductor layer; and
 a metal via in the first semiconductor layer and the buried insulator layer, the metal via electrically connecting the first inductor to the transistor.

7. The device of claim 1 wherein the first and second inductors comprise a radio frequency circuit.

8. The method of claim 1 comprising an adhesive material on the first integrated circuit die, the adhesive material bonding the first integrated circuit die to the second integrated circuit die.

9. The method of claim 1 wherein the first inductor coil includes a conductive bonding material that effects a eutectic bond between the first and second inductor coils.

10. An integrated circuit package including:
 a first integrated circuit die;
 a first inductor coil on a first surface of the first integrated circuit die;
 a second integrated circuit die coupled to the first integrated circuit die;
 a second inductor coil on a surface of the second integrated circuit die, the second inductor coil being aligned with and in ohmic contact with the first inductor coil;
 first control circuitry in the first integrated circuit die;
 second control circuitry in the second integrated circuit die;
 a first through via in the first integrated circuit die; and
 a second through via in the second integrated circuit die, the second through via being electrically connected to the first through via, the first control circuitry and the second control circuitry being electrically coupled together by the first and second through vias.

11. The integrated circuit package of claim 10 wherein the first integrated circuit die is an SOI integrated circuit die.

12. The integrated circuit package of claim 10 wherein the first inductor coil is on a back side of the first integrated circuit die.

13. The integrated circuit package of claim 10 wherein the first inductor coil is on a front side of the first integrated circuit die.

* * * * *